United States Patent
Arai et al.

(10) Patent No.: US 10,096,640 B2
(45) Date of Patent: Oct. 9, 2018

(54) SOLID-STATE IMAGING APPARATUS AND METHOD FOR MANUFACTURING THE SAME

(71) Applicant: Kabushiki Kaisha Toshiba, Minato-ku (JP)

(72) Inventors: Tomoyuki Arai, Kanagawa-ken (JP); Fumiaki Sano, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/728,339

(22) Filed: Jun. 2, 2015

(65) Prior Publication Data

US 2015/0325607 A1  Nov. 12, 2015

Related U.S. Application Data

(62) Division of application No. 13/420,939, filed on Mar. 15, 2012, now Pat. No. 9,076,705.

(30) Foreign Application Priority Data

Aug. 19, 2011  (JP) ................................ 2011-179545

(51) Int. Cl.
   *H01L 27/146*  (2006.01)
(52) U.S. Cl.
   CPC ...... *H01L 27/1464* (2013.01); *H01L 27/1461* (2013.01); *H01L 27/14627* (2013.01); *H01L 27/14643* (2013.01); *H01L 27/14603* (2013.01); *H01L 27/14607* (2013.01)

(58) Field of Classification Search
   CPC .......... H01L 27/1464; H01L 27/14641; H01L 27/14627; H01L 27/1461; H01L 27/14643
   See application file for complete search history.

(56) References Cited

U.S. PATENT DOCUMENTS

| 5,401,679 A | 3/1995 | Fukusho |
| 6,683,360 B1 | 1/2004 | Dierickx |
| 2003/0096443 A1 | 5/2003 | Hwang |
| 2005/0064620 A1* | 3/2005 | Han ................. H01L 27/14603 438/57 |

(Continued)

FOREIGN PATENT DOCUMENTS

JP  2010-267709  11/2010

*Primary Examiner* — Tucker J Wright
(74) *Attorney, Agent, or Firm* — Oblon, McClelland, Maier & Neustadt, L.L.P.

(57) ABSTRACT

Certain embodiments provide a solid-state imaging apparatus including a first impurity layer, a second impurity layer, a third impurity layer, and an electrode. The first impurity layer is a photoelectric conversion layer, and is formed to have a constant depth on a semiconductor substrate. The second impurity layer is formed on a surface of the first impurity layer, to have a depth which becomes shallower toward a direction from the first impurity layer to the third impurity layer. The third impurity layer is formed in a position spaced apart from the first impurity layer and the second impurity layer on the surface of the semiconductor substrate. The electrode can transport electric charges from the first impurity layer to the third impurity layer, and is formed between the second impurity layer and the third impurity layer, on the surface of the semiconductor substrate.

9 Claims, 12 Drawing Sheets

(56) References Cited

U.S. PATENT DOCUMENTS

| | | |
|---|---|---|
| 2005/0093036 A1 | 5/2005 | Han |
| 2006/0011955 A1 | 1/2006 | Baggenstoss |
| 2006/0022232 A1 | 2/2006 | Lim |
| 2006/0249764 A1 | 11/2006 | Huang et al. |
| 2007/0138590 A1 | 6/2007 | Wells et al. |
| 2009/0121264 A1 | 5/2009 | Kao |
| 2009/0181501 A1 | 7/2009 | Sekine et al. |
| 2010/0109060 A1 | 5/2010 | Mao et al. |
| 2010/0243864 A1 | 9/2010 | Itonaga |
| 2011/0298022 A1 | 12/2011 | Ha et al. |
| 2012/0175691 A1 | 7/2012 | Wu et al. |

* cited by examiner

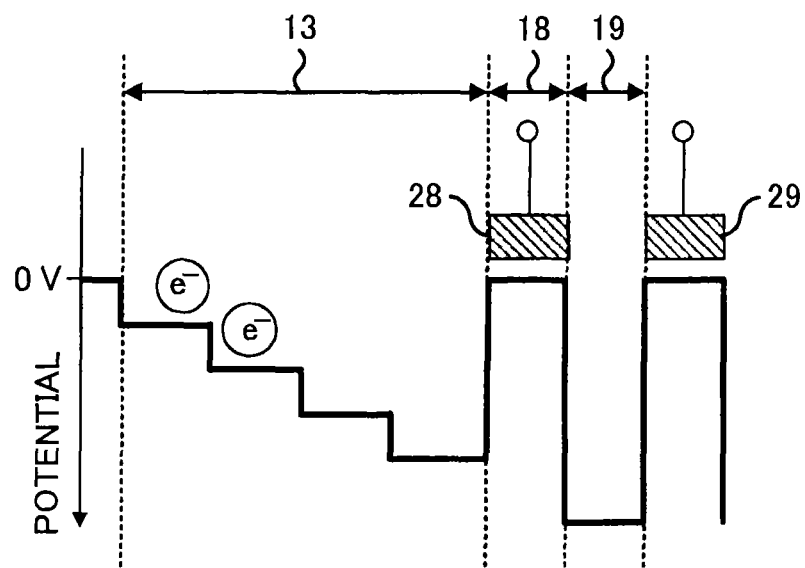
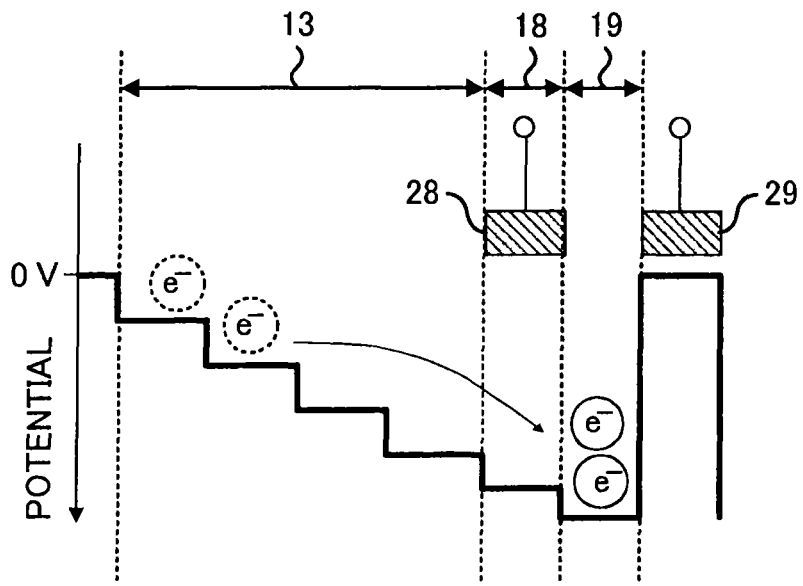

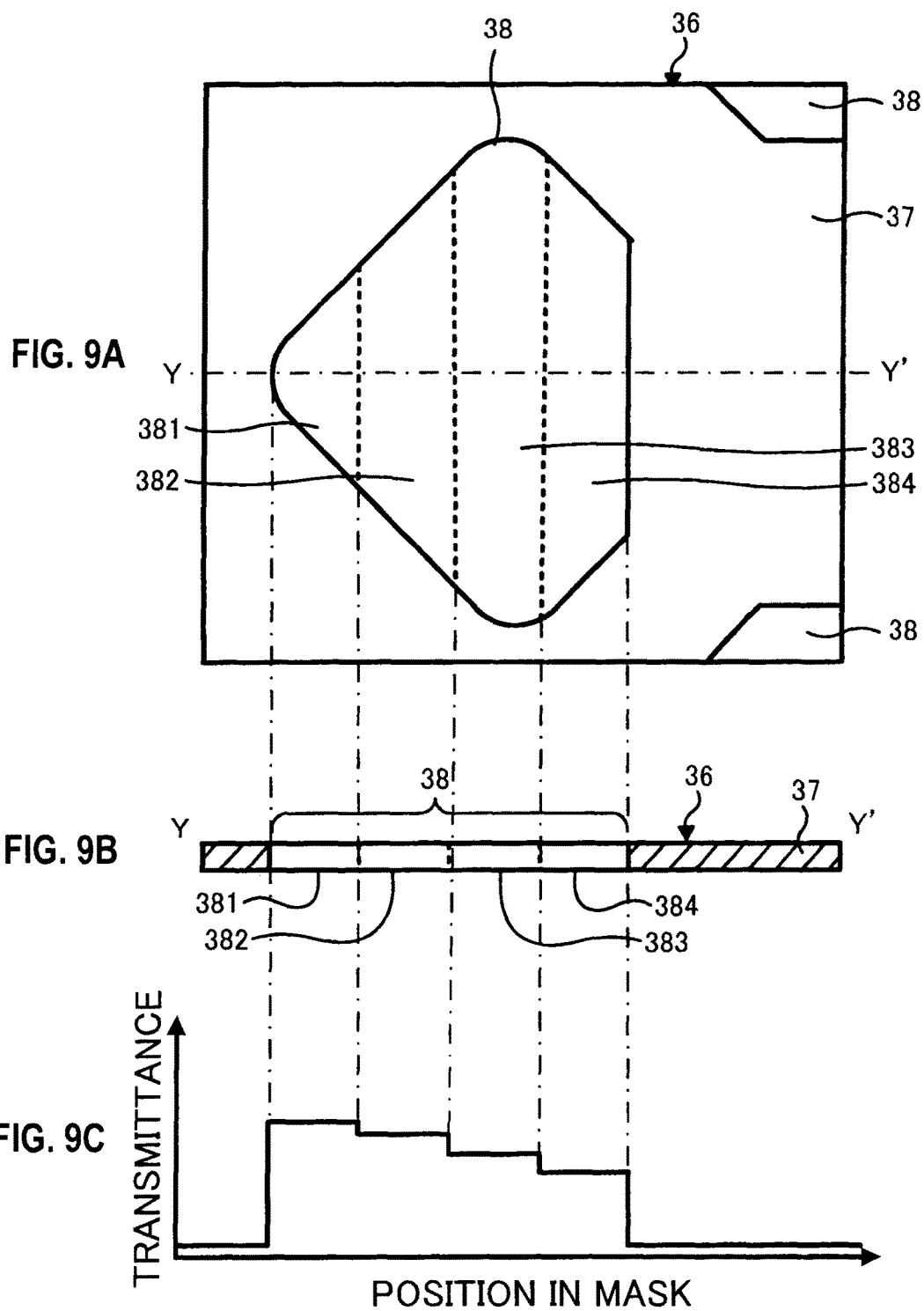

US 10,096,640 B2

SOLID-STATE IMAGING APPARATUS AND METHOD FOR MANUFACTURING THE SAME

CROSS REFERENCE TO RELATED APPLICATIONS

This application is a division of and claims the benefit of priority under 35 U.S.C. § 120 from U.S. Ser. No. 13/420,939 filed Mar. 15, 2012, and claims the benefit of priority under 35 U.S.C. § 119 from Japanese Patent Application No. 2011-179545 filed Aug. 19, 2011; the entire contents of each of which are incorporated herein by reference.

FIELD

Embodiments described herein relate generally to a solid-state imaging apparatus and method for manufacturing the same.

BACKGROUND

Generally, a pixel portion of a solid-state imaging apparatus has a photodiode which generates a certain amount of electrical charges based on an amount of light irradiation. The photodiode (hereinafter referred to as a PD) includes an "n" impurity layer formed on the surface of, for example, a "p" silicon substrate. A "p" impurity layer is formed on the surface of the "n" impurity layer, to eliminate the crystal defects of this surface.

In the pixel portion, a gate electrode is formed in a position adjacent to the PD on the silicon substrate. Further, a floating diffusion (FD) including an "n+" impurity layer is formed in a position adjacent to the gate electrode, on the surface of the silicon substrate.

In this pixel portion of the solid-state imaging apparatus, a voltage is applied to the gate electrode, and the potential right under the gate electrode becomes deep, thereby transporting the electric charges generated in the PD to the FD.

In a conventionally-known solid-state imaging apparatus, to improve the transport efficiency when transporting the electric charges generated in the PD to the FD, an "n" impurity layer included in the PD is formed deep in a stair-like manner toward a transport direction of the electric charges. This "n" impurity layer is formed through a plurality of times of ion implantation. According to the solid-state imaging apparatus, in the PD, the potential is formed deep in a stair-like manner toward the transport direction of the electric charges, thus improving the transport efficiency of the electric charges.

BRIEF DESCRIPTION OF THE DRAWINGS

FIGS. 8A and 8E are explanatory diagrams for explaining a charge transport operation by the pixel portion of the solid-state imaging apparatus according to the first embodiment, FIG. 8A shows potentials created in the pixel portion, when no voltage is applied to a gate electrode, and FIG. 8B shows a potential created in the pixel portion, when a voltage is applied to the gate electrode;

FIGS. 9A to 9C are diagrams for explaining a grating mask for forming a resist layer including a concave portion, FIG. 9A is a partial top view of a grating mask, FIG. 9B is a partial cross sectional view of the grating mask, taken along a dashed line Y-Y' of FIG. 9A, and FIG. 9C shows transmittance characteristics of the grating mask;

FIG. 13A is a partial top view of the grating mask, FIG. 13B is a partial cross sectional view of the grating mask, taken along a dashed line Y-Y' of FIG. 13A, and FIG. 13C shows transmittance characteristics of the grating mask;

FIG. 17A shows potentials created in the pixel portion, when no voltage is applied to a gate electrode, and FIG. 173 shows potentials created in the pixel portion, when a voltage is applied to the gate electrode.

DETAILED DESCRIPTION

Certain embodiments provide a solid-state imaging apparatus including a first impurity layer, a second impurity layer, a third impurity layer, and an electrode. The first impurity layer is an impurity layer which generates electric charges by irradiating light to the first impurity layer, and is formed to have a constant depth on a semiconductor substrate. The second impurity layer is formed to have a depth which becomes shallower toward a predetermined direction on a surface of the first impurity layer. The predetermined direction is a direction from the first impurity layer to the third impurity layer. The third impurity layer is an impurity layer to which the electric charges generated in the first impurity layer are transported, and is formed in a position spaced apart from the first impurity layer and the second impurity layer. The electrode reads the electric charges generated in the first impurity layer, transports them to the third impurity layer, and is formed between the second impurity layer and the third impurity layer on the surface of the semiconductor substrate.

Certain embodiments provide method for manufacturing a solid-state imaging apparatus, including forming a first impurity layer, forming a resist layer including a concave portion, forming a second impurity layer, forming a third impurity layer, and forming an electrode. The first impurity layer is formed to have a constant depth through one ion implantation. The concave portion of the resist layer has a thickness which becomes thicker in a predetermined direction. The resist layer is formed on the semiconductor substrate in such a manner that the concave portion is arranged on the first impurity layer. The second impurity layer has a depth which becomes shallower toward the predetermined direction and is formed by implanting ions to the surface of the first impurity layer through the resist layer. The direction of the concave portion of the resist layer and the direction of the second impurity layer are directions from the first impurity layer to the third impurity layer. The third impurity layer is an impurity layer to which electric charges generated upon irradiation of light to the first impurity layer are transported. The third impurity layer is formed in a position spaced apart from the first impurity layer and the second impurity layer. The electrode is capable of reading electric charges generated in the first impurity layer and transporting them to the third impurity layer. The electrode is formed between the second impurity layer and the third impurity layer, on the surface of the semiconductor substrate.

Descriptions will now specifically be made to a solid-state imaging apparatus and its manufacturing method, according to the embodiments, with reference to the drawings.

First Embodiment

Figure 1:
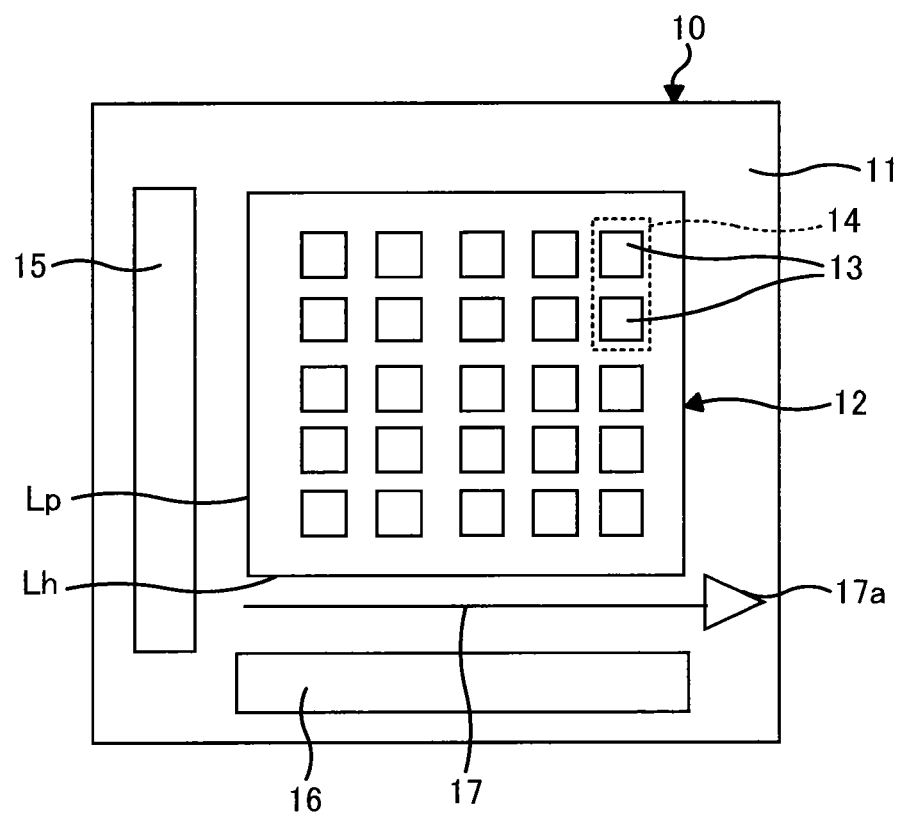
FIG. 1 is a top view exemplarily showing a solid-state imaging apparatus according to the first embodiment of the present invention.

FIG. 1 is a top view exemplarily showing the solid-state imaging apparatus according to the first embodiment. In the solid-state imaging apparatus 10 shown in FIG. 1, a rectangular imaging field 12 is provided on the surface of a semiconductor substrate 11 which is formed of, for example, silicon. The imaging field 12 is composed of a plurality of pixels 13 arranged in matrix. As will be described later, two pixels 13 adjacent to each other in a vertical direction (lengthwise in the illustration) form a pixel portion 14, referred to as a cell.

A vertical scanning circuit 15, a horizontal scanning circuit 16, and a signal output circuit 17 are provided in a position adjacent to the imaging field 12 on the surface of the semiconductor substrate 11.

The vertical scanning circuit 15 and the horizontal scanning circuit 16 are circuits for selecting the pixel 13 and reading electric charges from the selected pixel 13. The vertical scanning circuit 15 is provided in parallel to one side Lp as a part of the imaging field 12. The horizontal scanning circuit 16 is provided in parallel to the other side Lh as a part of the imaging field 12. That is, the circuit 16 is provided in parallel to the other side Lh vertical to the side Lp.

The signal output circuit 17 outputs the electric charges read from each pixel 13 as an image signal, externally from the solid-state imaging apparatus 10. An output end of the signal output circuit 17 is connected to an amplification unit 17a which amplifies the image signal. The signal output circuit 17 is provided along the horizontal scanning circuit 16 between the side Lh of the imaging field 12 and the horizontal scanning circuit 16.

In thus configured solid-state imaging apparatus 10, when the pixel is selected by the vertical scanning circuit 15 and the horizontal scanning circuit 16, the electric charges are read from the selected pixel 13. The read charges are transported to the signal output circuit 17, and are output externally from the solid-state imaging apparatus 10 as an image signal.

Figure 2:
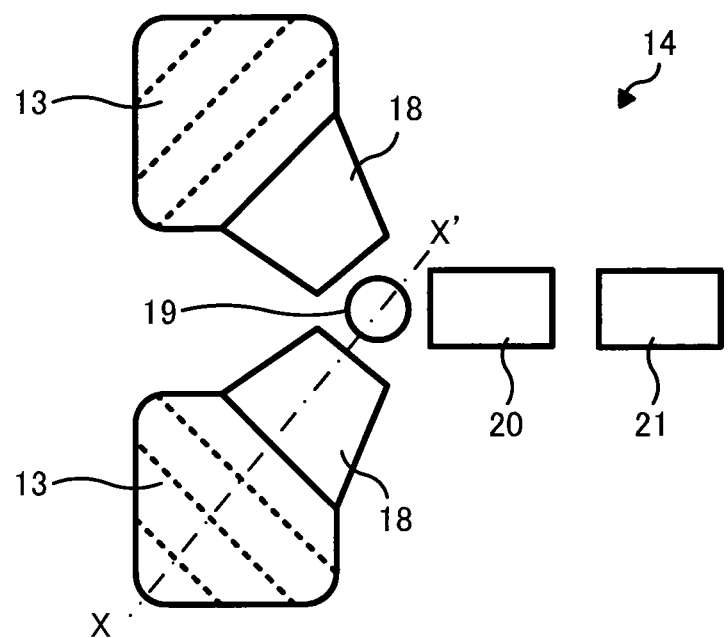
FIG. 2 is a top view showing a configuration of a pixel portion.

FIG. 2 is a top view exemplarily showing an enlarged view of the pixel portion 14 provided in the imaging field 12. The pixel portion 14 shown in FIG. 2, that is, the cell 14, is a two-pixel-one-cell type pixel portion 14. This pixel portion 14 includes two pixels 13, a transfer gate unit 18, a floating diffusion unit 19 (hereinafter referred to as an FD unit 19), a reset gate unit 20, and an amplifier gate unit 21.

The transfer gate unit 18 is a charge read unit which reads the electric charges generated in each pixel 13 and transfers the read charges to the FD unit 19. The transfer gate unit 18 is provided adjacent to each pixel 13, in an area corresponding to the corner part of each pixel 13.

The FD unit 19 is a signal output unit which converts the electric charges transported from each pixel 13 into a voltage signal, and outputs the converted voltage signal to the signal output circuit 17 through the amplifier gate unit 21. The FD unit 19 is provided between the transfer gate units 18 of the pixels 13. The voltage signal output to the signal output circuit 17 is output externally from the solid-state imaging apparatus 10 as an image signal.

The reset gate unit 20 is provided adjacent to the FD unit 19, and discharges the excess electric charges accumulated in the FD unit 19. The amplifier gate unit 21 is provided adjacent to the reset gate unit 20, amplifies the voltage extracted by the FD unit 19, and transports the amplified voltage to the signal output circuit 17.

Figure 3:
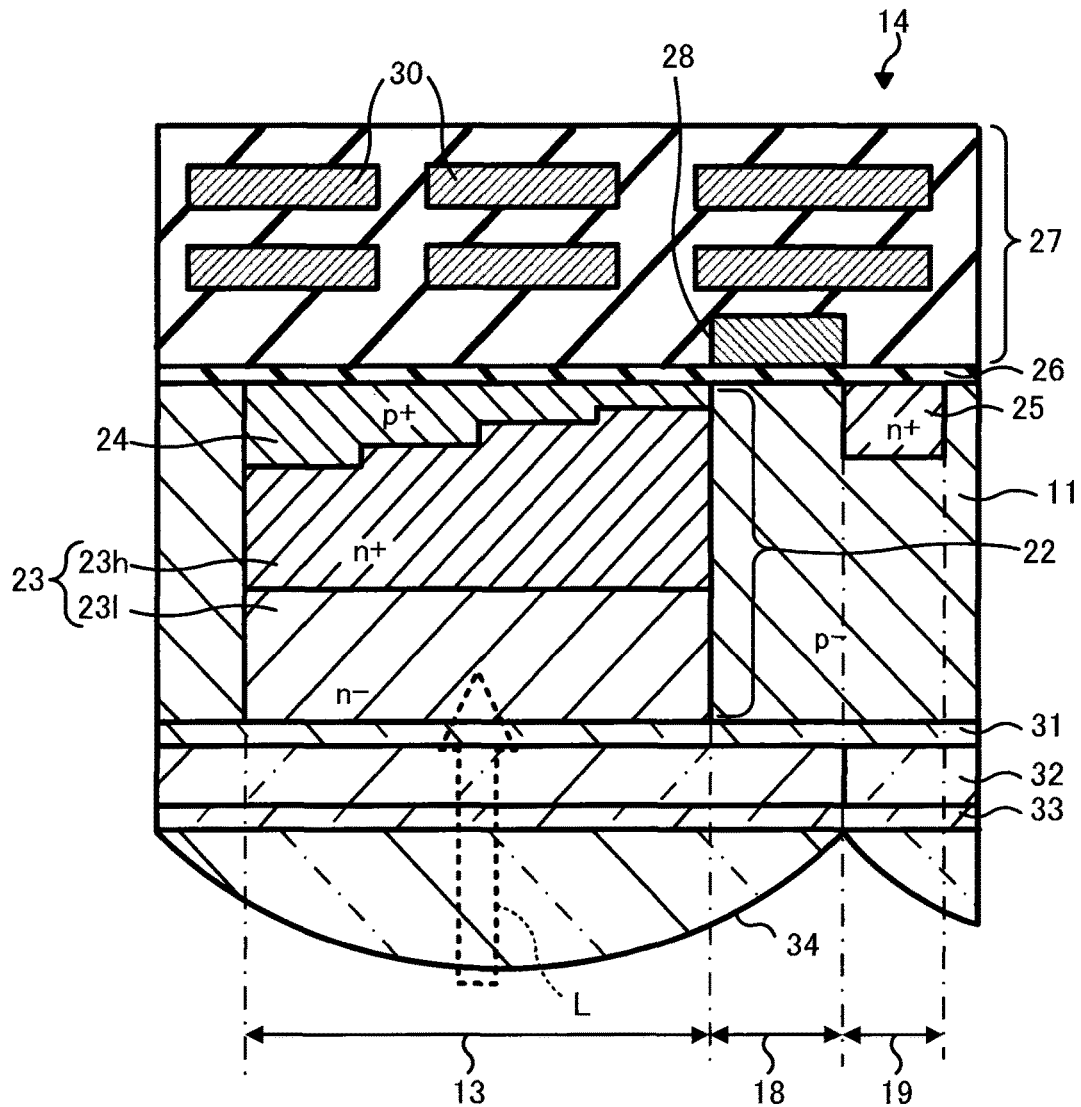
FIG. 3 is a cross sectional view of the pixel portion, taken along a dashed line X-X' of FIG. 2.

FIG. 3 is a partial cross sectional view of the pixel portion 14, taken along a dashed line X-X' of FIG. 2. In the pixel portion 14 of FIG. 3, a photodiode layer 22 (hereinafter referred to as a PD layer 22) is embedded in a "p−" semiconductor substrate 11. The PD layer 22 is exposed both from the front surface and back surface of the semiconductor substrate 11. That is, the layer 22 is formed to penetrate through the semiconductor substrate 11.

The PD layer 22 is composed of an "n" first impurity layer 23 and a "p+" second impurity layer 24. The first impurity layer 23 includes a low concentration impurity layer 23l and a high concentration impurity layer 23h. The second impurity layer 24 is formed on the front surface of the first impurity layer 23. The low concentration impurity layer 23l of the first impurity layer 23 is exposed from the back surface of the semiconductor substrate 11, while the second impurity layer 24 is exposed from the front surface of the semiconductor substrate 11.

The first impurity layer 23 is a photoelectric conversion layer for generating electric charges by irradiating light received from the back surface of the semiconductor substrate 11 to the first impurity layer 23. The low concentration impurity layer 23*l* and the high concentration impurity layer 23*h* included in this layer 23 are formed to have a constant depth.

The second impurity layer 24 is a barrier layer for eliminating the crystal defects of the surface of the PD layer 22 exposed from the front surface of the semiconductor substrate 11. As shown in FIGS. 2 and 3, this layer 24 is formed toward a third impurity layer 25 as the FD unit 19, that is, formed to be shallower in a stair-like manner toward the transport direction of the electric charges.

Because this second impurity layer 24 is a barrier layer as described above, it is preferably formed on the entire front surface of the high concentration impurity layer 23*h*.

The depth of the deepest part of the second impurity layer 24 is approximately the same as that of the second impurity layer formed in the conventional solid-state imaging apparatus. Thus, the second impurity layer 24 is formed to be shallower than the conventional second impurity layer toward the transport direction of the electric charges. As a result, a depletion layer formed at the boundary part between the first impurity layer 23 and the second impurity layer 24 is wider onto the entire front surface of the semiconductor substrate 11 than that of the conventional solid-state imaging apparatus.

On the front surface of the semiconductor substrate 11, the "n+" third impurity layer 25 is formed in a position spaced apart from the PD layer 22. The third impurity layer 25 is included in the FD unit 19. The electric charges generated in the PD layer 22 are transported to the third impurity layer 25 included in the FD unit 19.

On the front surface of thus formed semiconductor substrate 11, a wiring layer 27 is formed through an oxide film 26. This wiring layer 27 includes a gate electrode 28 included in the transfer gate unit 18, a reset gate electrode 29 (FIG. 8) included in the reset gate unit 20, and an amplifier gate electrode (not illustrated) included in the amplifier gate unit 21. Further, the wiring layer 27 includes wiring 30. This wiring 30 connects the vertical scanning circuit 15, the horizontal scanning circuit 16, and the signal output circuit (FIG. 1), with a predetermined area of the pixel portion 14.

The gate electrode 28 is formed in a halfway point between the PD layer 22 and the third impurity layer 25 on the oxide film 26 on the front surface of the semiconductor substrate 11. This gate electrode 28 is formed, for example, of polysilicon.

On the back surface of the semiconductor substrate 11, a first planarizing layer 31, a color filter layer 32, and a second planarizing layer 33 are sequentially laminated in this order. Further, on the back surface of the second planarizing layer 33, a micro-lens 34 is formed in a position corresponding to the PD layer 22. The micro-lens 34 condenses incident light from the back surface of the semiconductor substrate 11, to the PD layer 22.

Descriptions will now be made to a method for manufacturing the solid-state imaging apparatus 10 according to this embodiment. This manufacturing method has a characteristic feature in a process for forming its pixel portion 14. Other parts are manufactured in accordance with a generally-known method. Thus, the method for manufacturing the pixel portion 14 will now be described with reference to FIGS. 4 to 7. FIGS. 4 to 7 are cross sectional views corresponding to FIG. 3 showing the method for manufacturing the pixel portion 14. FIGS. 4 to 7 show processes for manufacturing an arbitrary one pixel 13 and the pixel portion 14 including this pixel 13. Another pixel 13 included in the same pixel portion 14 and the entire rest of pixel portions 14 are formed at the same time in each process shown in FIGS. 4 to 7.

Figure 4:
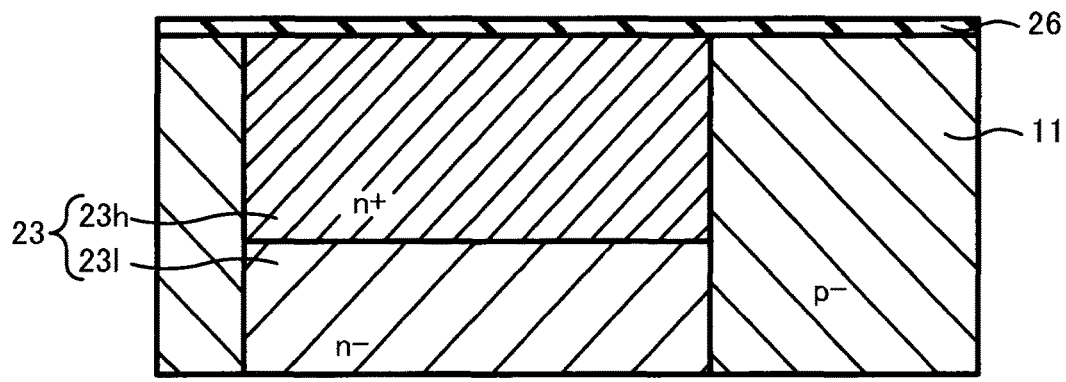
FIG. 4 is a diagram showing a method for manufacturing the solid-state imaging apparatus of FIG. 1, and is a cross sectional view showing a process for forming first and second impurity layers of a photodiode layer.

As shown in FIG. 4, the "n−" low concentration impurity layer 23*l* is formed to penetrate through the "p−" semiconductor substrate 11 in (on) this substrate 11. Subsequently, the "n+" high concentration impurity layer 23*h* is formed to have a predetermined depth in the same area as the area of the low concentration impurity layer 23*l*. As a result, the first impurity layer 23 is formed in (on) the semiconductor substrate 11.

The low concentration impurity layer 23*l* is formed by forming a resist layer (not illustrated) with an opening in a predetermined area through the oxide film 26 on the front surface of the semiconductor substrate 11, and implanting ions only once with using the resist layer as a mask. The high concentration impurity layer 23*h* is formed by implanting ions only once, with using the resist layer (not illustrated) used for forming the low concentration impurity layer 23*l* as a mask.

After the first impurity layer 23 is formed, the resist layer used for forming them is removed.

Figure 5:
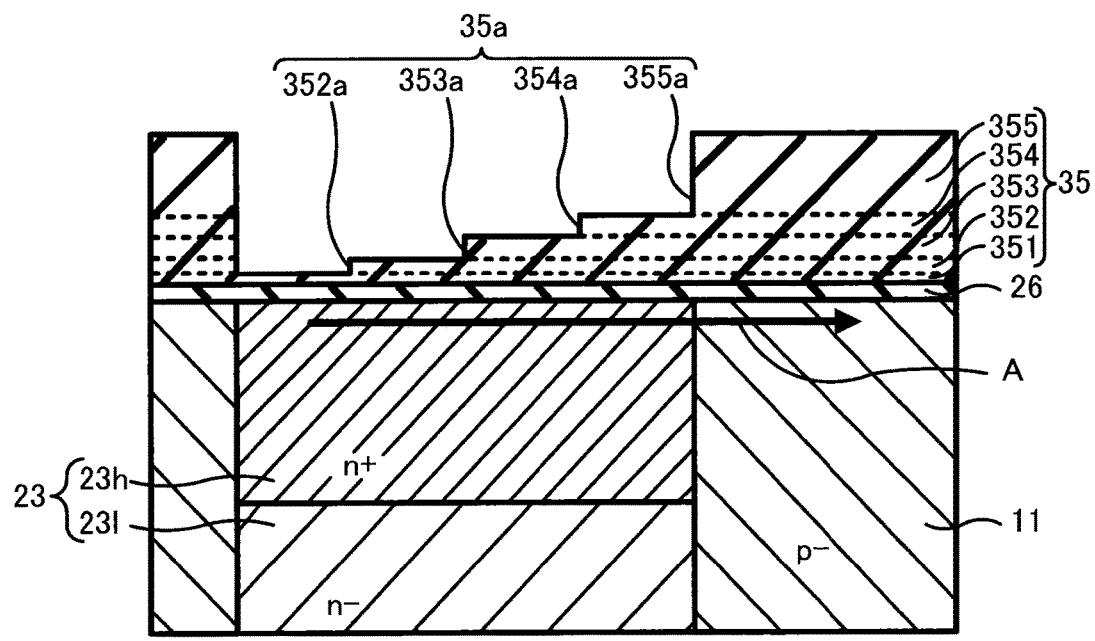
FIG. 5 is diagram showing a method for manufacturing the solid-state imaging apparatus of FIG. 1, and is across sectional view showing a process for forming a resist layer.

As shown in FIG. 5, a resist layer 35 including a concave portion 35*a* in a formation area of the first impurity layer 23 is then formed through the oxide film 26 on the front surface of the semiconductor substrate 11. The concave portion 35*a* of the resist layer 35 has a bottom which becomes thicker in a stair-like manner toward the transport direction of the electric charges (in an arrow direction of "A" in the illustration).

This resist layer 35 is formed of first to fifth resist films 351 to 355 sequentially from the bottom. On the first resist film 351 with a constant thickness, the second to fifth resist films 352, 353, 354, and 355 are laminated. The second to fifth resist films 352, 353, 354, and 355 have wider openings 352*a*, 353*a*, 354*a*, and 355*a*, in the higher level of layer.

A part of the bottom surface of the concave portion 35*a* of the resist layer 35 may penetrate through the resist layer 35. The resist layer 35 of this case is composed of the second to fifth resist layers 352 to 355.

Figure 6:
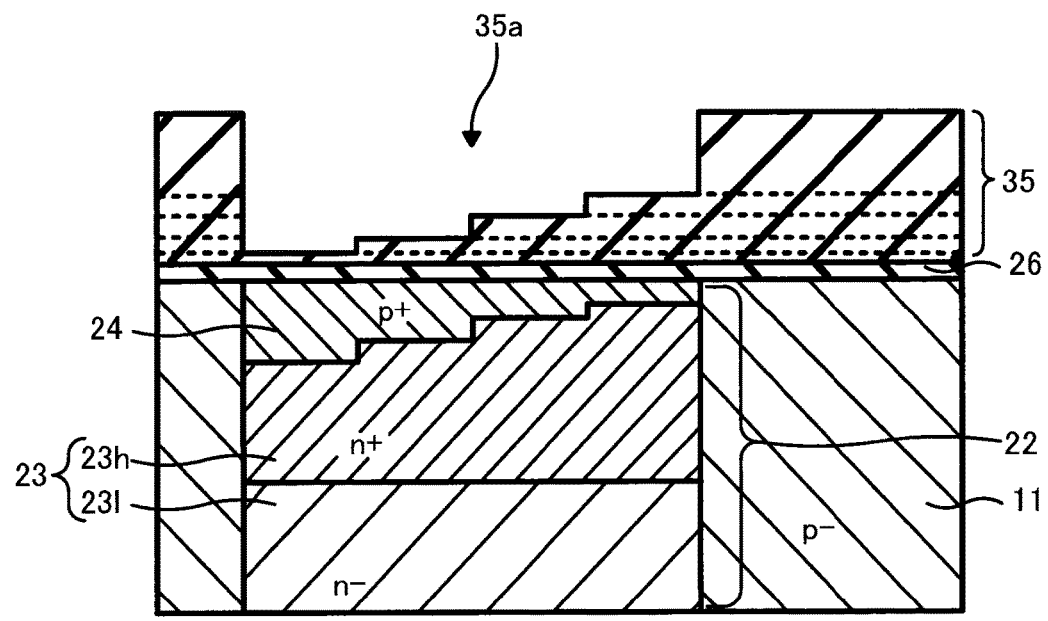
FIG. 6 is a diagram showing a method for manufacturing the solid-state imaging apparatus of FIG. 1, and is a cross sectional view showing a process for forming a third impurity layer of the photodiode layer.

As shown in FIG. 6, desired ions are implanted to the surface of the first impurity layer 23, by using the resist layer 35 formed in the process of FIG. 5 as a mask, thereby forming the "p+" second impurity layer 24.

In this process, the desired ions penetrate through the bottom surface of the concave portion 35*a* of the resist layer 35, and reach the high concentration impurity layer 23*h* of the first impurity layer 23. This depth depends on the thickness of the bottom surface. That is, the desired ions reach farther, as the bottom surface of the concave portion 35*a* is thinner. Thus, if the predetermined ions are implanted with using the resist layer 35 with the concave portion 35*a* of FIG. 5 as a mask, the second impurity layer 24 which is shallower in a stair-like manner along the transport direction of the electric charges is formed based on the thickness of the bottom surface of the concave portion 35*a*.

Figure 7:
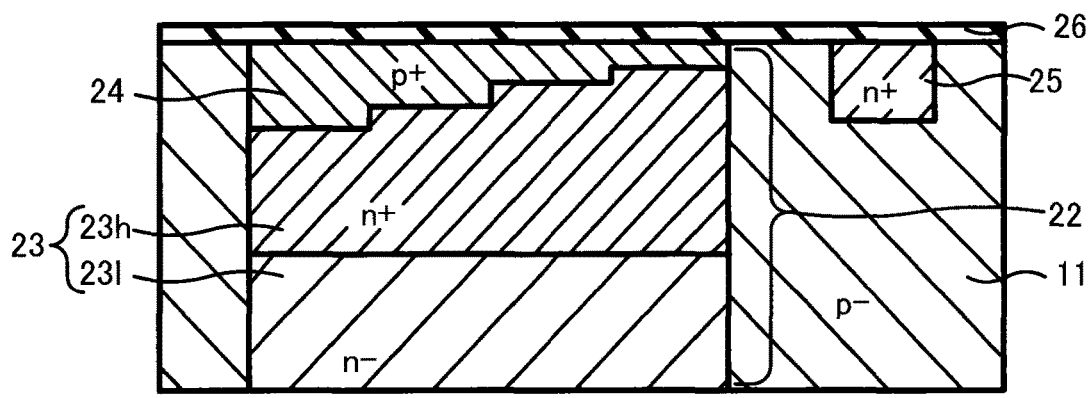
FIG. 7 is a diagram showing a process for manufacturing the solid-state imaging apparatus of FIG. 1, and is across sectional view showing a process for forming a fourth impurity layer.

Accordingly, after the PD layer 22 is formed, the resist layer 35 for forming the second impurity layer 24 is removed. Subsequently, as shown in FIG. 7, the "n+" third impurity layer 25 is formed in a predetermined area on the front surface of the semiconductor substrate 11, spaced apart from the PD layer 22.

The third impurity layer 25 may be formed before the PD layer 22 is formed.

After this, the wiring layer 27 is formed on the front surface of the semiconductor substrate 11. At the same time, on the back surface of the semiconductor substrate 11, the first planarizing layer 31, the color filter layer 32, the second planarizing layer 33, and the micro-lens 34 are formed sequentially in this order. As a result of this, the pixel portion 14 shown in FIG. 3 is formed.

Thus formed pixel unit 14 transports the electric charges generated in the PD layer 22 to the FD unit 19, upon application of a voltage to the gate electrode 28. This operation for transporting the electric charges by the pixel portion 14 will now be described with reference to FIGS. 8A and 8B. FIGS. 8A and 8B are explanatory diagrams for explaining the operation for transporting the electric charges by the pixel portion 14. Specifically, FIG. 8A shows the potential created by the pixel portion 14, when no voltage is applied to the gate electrode 28, while FIG. 8B shows the potential created by the pixel portion 14, when a voltage is applied to the gate electrode 28.

As shown in FIG. 8A, the potentials of the pixel 13 and the FD unit 19 become deeper than that of the surrounding semiconductor substrate 11, when no voltage is applied to the gate electrode 28. The pixel 13 includes the "p+" second impurity layer 24, while the FD unit 19 includes the "n+" third impurity layer 25. Thus, the potential of the pixel 13 gets shallower than that of the FD unit 19. Further, the depth of the "p+" second impurity layer 24 is shallower in a stair-like manner toward the transport direction of the electric charges. Thus, the potential of the pixel 13 gets deeper in a stair-like manner toward the transport direction of the electric charges.

When no voltage is applied to the gate electrode 28, the potential of the semiconductor substrate 11 right under the gate electrode 28 forms a potential barrier. Thus, the electric charges generated in the pixel 13 are not transported to the FD unit 19 and are accumulated in the pixel 13. In this case, the electric charges generated in the pixel 13 are accumulated in an order sequentially from parts with deeper potential.

In a state where the electric charges are accumulated in the pixel 13, if a voltage is applied to the gate electrode 28, the potential of the semiconductor substrate 11 right under the gate electrode 28 becomes deeper, as shown in FIG. 8B. For example, a desired voltage is applied to the gate electrode 28, and the potential of the semiconductor substrate 11 right under the gate electrode 28 is deeper than that of the pixel 13 and shallower than that of the FD unit 19. In this case, the electric charges accumulated in the pixel 13 are transported to the FD unit 19. At this time, the potential of the pixel 13 becomes deeper in a stair-like manner toward the transport direction of the electric charges, thus enabling to efficiently transport the electric charges.

According to the solid-state imaging apparatus 10 and the method for manufacturing the solid-state imaging apparatus 10 of this embodiment, the "p+" second impurity layer 24 of the PD layer 22 has a depth which becomes shallower toward the transport direction of the electric charges. As a result, the PD layer 22 forms potential that becomes deeper toward the transport direction of the electric charges. Therefore, it is possible to provide the solid-state imaging apparatus 10 and its manufacturing method, capable of improving the transport efficiency of the electric charges.

According to the solid-state imaging apparatus 10 and its manufacturing method of this embodiment, the "p+" second impurity layer 24 which becomes shallower toward the transport direction of the electric charges is applied to a backside illuminated solid-state imaging apparatus. In the case of the backside illuminated solid-state imaging apparatus, the second impurity layer 24 is formed on the front surface of the semiconductor substrate 11, while incident light L is irradiated from the back surface of the semiconductor substrate 11 (FIG. 3). Of the irradiated light L, especially visible light is photoelectric-converted near the back surface of the PD layer 22. The second impurity layer 24 exists in a deep part of the PD layer 22, as seen from the incident light L. Thus, the photoelectric conversion area of the irradiated incident light L with respect to the visible light is approximately constant regardless of the wavelength. According to the backside illuminated solid-state imaging apparatus of this embodiment and its manufacturing method, the light sensitivity with respect to the visible light of the incident light L can approximately be constant regardless of the wavelength.

On the contrary, if the second impurity layer is applied to the frontside illuminated solid-state imaging apparatus, the second impurity layer is formed on the front surface of the semiconductor substrate, and also the incident light is irradiated from the front surface of the semiconductor substrate. That is, the second impurity layer exists on the surface layer part of the PD layer, as seen from the incident light. The shorter the wavelength components (blue components), the narrower the photoelectric conversion areas of the irradiated incident light with respect to the visible light. Thus, according to the frontside illuminated solid-state imaging apparatus, the light sensitivity for the short wavelength component of the incident light is deteriorated.

Modification of First Embodiment

The process for forming the resist layer 35 including the concave portion 35a, as shown in FIG. 5, is not limited to the above process. For example, a resist layer 35' like the resist layer 35 may be formed, using a grating mask with different transmittance for exposure light depending on the positions. Descriptions will now be made to a process for forming the resist layer 35' including a concave portion 35a' using the grating mask, with reference to FIGS. 9 to 11.

FIGS. 9A to 9C are diagrams for explaining a grating mask 36 for forming the resist layer 35' including the concave portion 35a'. Specifically, FIG. 9A is a partial top view of the grating mask 36, FIG. 9B is a partial cross sectional view of the grating mask 36, taken along a dashed line Y-Y' of FIG. 9A, and FIG. 9C shows transmittance characteristics of the grating mask 36.

As shown in FIGS. 9A and 9B, the grating mask includes a low transmission region 37 through which light is not nearly transmitted, and a high transmission region 38 through which light is transmitted.

In the grating mask 36, the transmittance of the exposure light are adjusted, by forming a plurality of dots intercepting the exposure light in accordance with a changed arrangement density or area, on an optical transparent substrate, such as a glass. The low transmission region 37 includes a plurality of densely arranged dots or a plurality of dots each having a large area, to eliminate transmission of exposure light. The high transmission region 38 includes a plurality of dots that are arranged in lower density than the dot arrangement density in the low transmission region, or includes a plurality of dots with a smaller area than the area of the dots in the low transmission region.

As shown in FIG. 9A, the transmission region 38 has a form corresponding to its pixel 13 formed. A plurality of the transmission regions 38 are provided in one grating mask 36. The plurality of transmission regions 38 are arranged in matrix in accordance with the arrangement of the pixels 13.

As shown in FIG. 9C, each of the transmission regions 38 is formed so that the transmittance of the exposure light in the transmission region 38 decreases in a stair-like manner toward the direction of Y-Y' of FIG. 9A.

The transmission region 38 having such transmittance characteristics is divided into four: a first transmission area 381; a second transmission region 382; a third transmission area 383; and a fourth transmission region 384, in a direction from "Y" to "Y'" of FIG. 9A. In this case, the arrangement density or area of the plurality of dots formed in the first transmission region 381 is lower (smaller) than the arrangement density or area of the plurality of dots formed in the second transmission region 382. Similarly, the arrangement density or area of the plurality of dots formed in the second transmission region 382 is lower (smaller) than the arrangement density or area of the plurality of dots formed in the third transmission region 383. Further, the arrangement density or area of the plurality of dots formed in the third transmission region 383 is lower (smaller) than the arrangement density or area of the plurality of dots formed in the fourth transmission region 384.

The arrangement densities or areas of the dots formed in the regions 381 to 384 are adjusted as described above, thereby realizing the transmittance characteristics shown in FIG. 9C.

Figure 10:
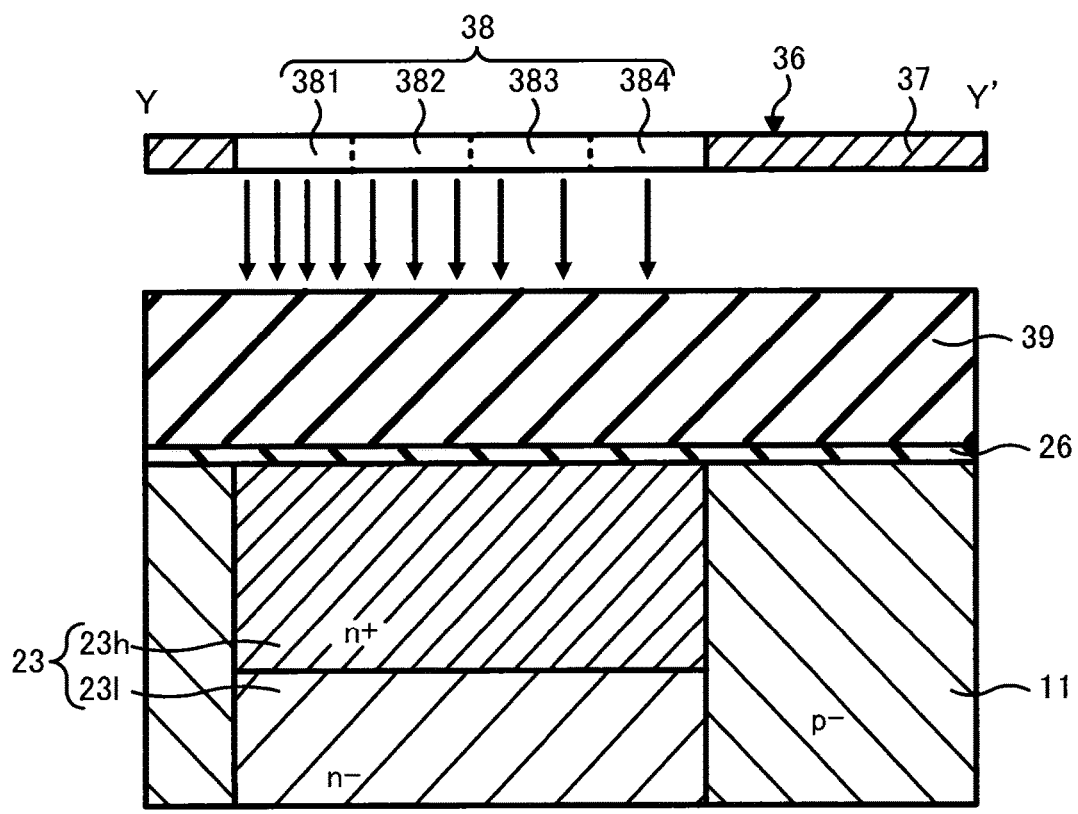
FIG. 10 is a diagram for explaining a method for forming a resist layer including a concave portion, using the grating mask shown in FIG. 9, and is a cross sectional view showing an exposure process for a resist member having a constant thickness.
Figure 11:
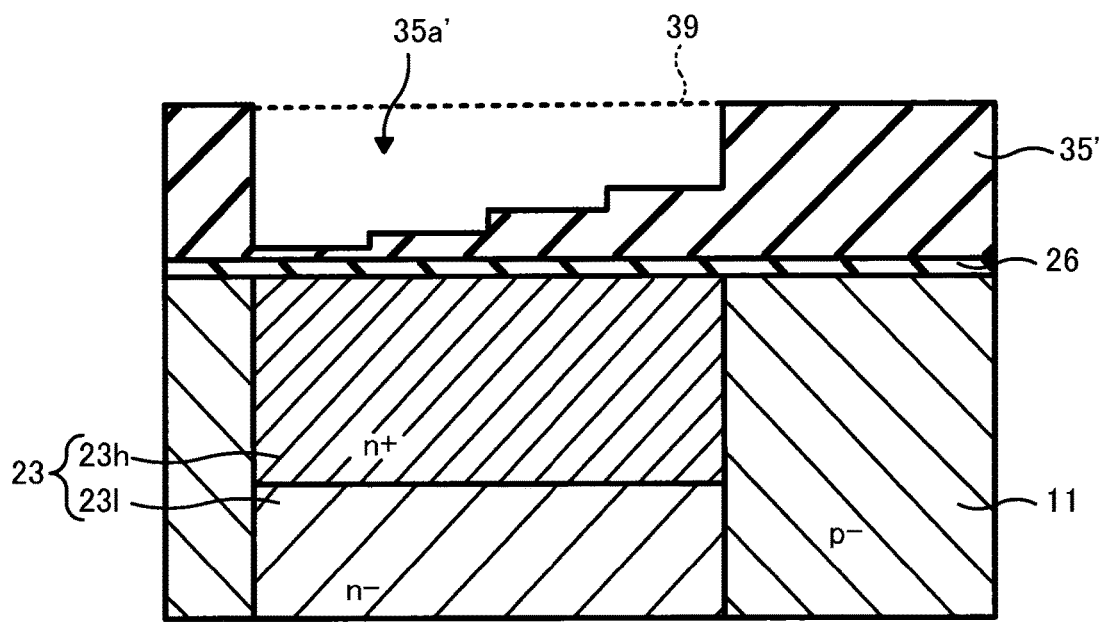
FIG. 11 is a diagram for explaining a method for forming a resist layer including a concave portion, using the grating mask shown in FIG. 9, and is a cross sectional view showing a process for developing the exposed resist member.

Descriptions will now be made to a process for forming the resist layer 35' including the concave portion 35a' by using thus formed grating mask 36, with reference to FIGS. 10 and 11. FIGS. 10 and 11 are cross sectional views corresponding to FIG. 5, for explaining a process for forming the resist layer 35' including the concave portion 35a' by using the grating mask 36.

As shown in FIG. 10, a resist member 39 having a constant thickness is formed through the oxide film 26, on the front surface of the semiconductor substrate 11. Further, the grating mask 36 is arranged in such a manner that the direction from "Y" to Y' coincides with the transport direction of the electric charges, on the semiconductor substrate 11 on which this resist member 39 is formed. After this, the resist member 39 is exposed by using the grating mask 36.

The exposure light transmits through the transmission region 38 of the grating mask 36, thus being irradiated to the resist member 39 right under the transmission region 38. The transmittance of the transmission region 38 decrease sequentially in the order from the first transmission region 381, the second transmission region 382, the third transmission region 383, and the fourth transmission region 384. A larger amount of exposure light is irradiated to the resist member 39 right under the first transmission region 381 than to the resist member 39 right under the second transmission region 382. Similarly, a larger amount of exposure light is irradiated to the resist member 39 right under the second transmission area 382 than to the resist member 39 right under the third transmission area 383. Further, a larger amount of exposure light is irradiated to the resist member 39 right under the third transmission region 383 than to the resist member 30 right under the fourth transmission region 384.

If thus-exposed resist member 39 is developed, the more the irradiated part with the exposure light in the resist member 39, the more removed. The resist layer 35', with the concave portion 35a' having a bottom thickness which gets thicker in a stair-like manner toward the transport direction of the electric charges, is formed. Accordingly, the resist layer 35' including the concave portion 35a' may be formed.

Second Embodiment

A solid-state imaging apparatus according to the second embodiment includes a "p+" second impurity layer 41 of the pixel portion 14 which has a different form from that of the solid-state imaging apparatus of the first embodiment. Descriptions will now be made to the second impurity layer 41 formed in the pixel portion 14 of a solid-state imaging apparatus 40 according to the second embodiment, with reference to FIG. 12.

Figure 12:
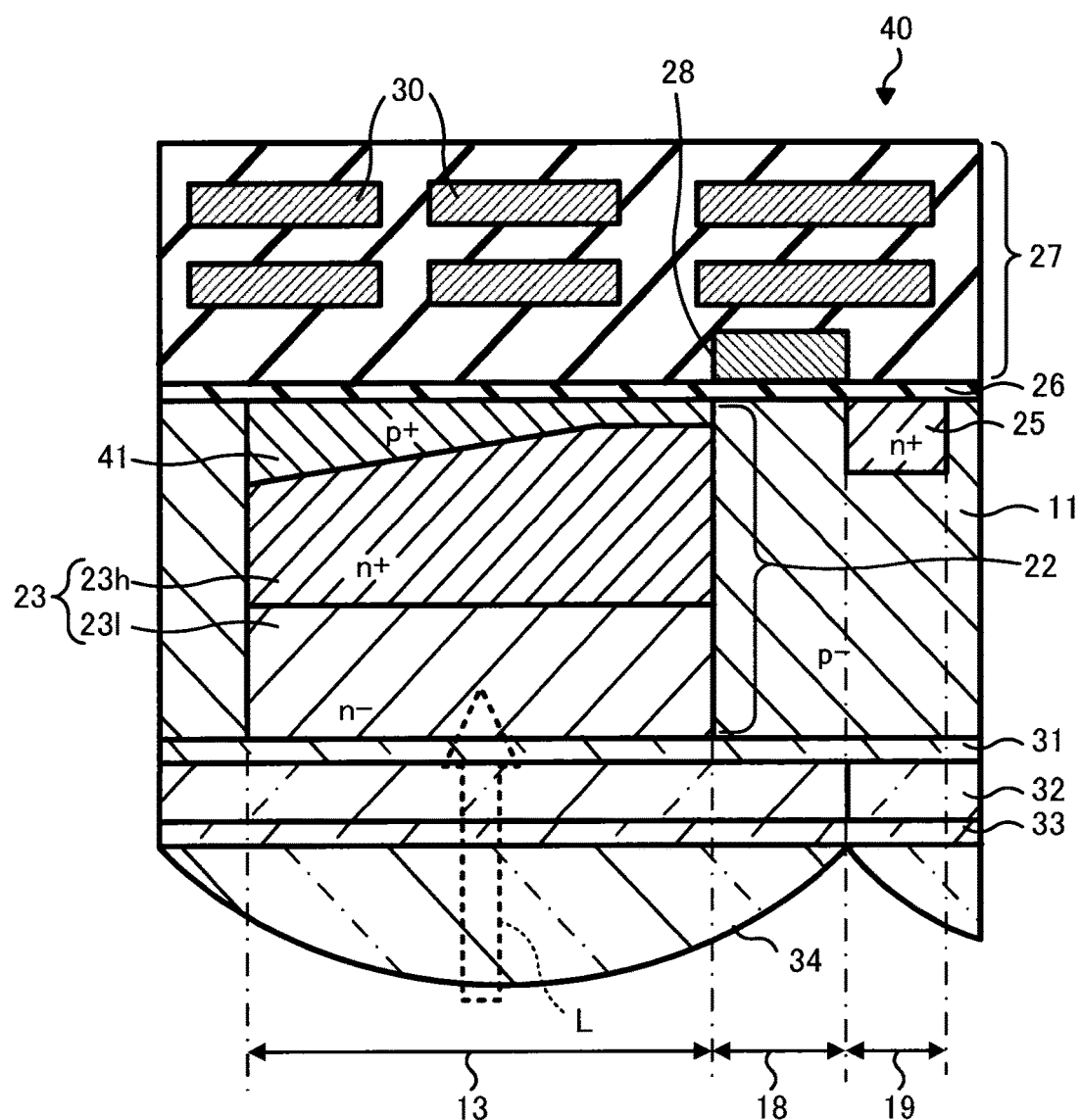
FIG. 12 is a cross sectional view showing a pixel portion of a solid-state imaging apparatus according to the second embodiment.

FIG. 12 is a cross sectional view corresponding to FIG. 3, and shows the pixel portion 14 of the solid-state imaging apparatus according to the second embodiment of the present invention. In the solid-state imaging apparatus 40 shown in FIG. 12, the second impurity layer 41 becomes shallower in a slope-like manner up to a predetermined area toward the third impurity layer 25 as the FD unit 19, that is, toward the transport direction of the electric charges. After this, the layer 41 is formed to have a constant depth.

The depth of the deepest part of the second impurity layer 41 is approximately the same as the depth of the second impurity layer formed in the conventional solid-state imaging apparatus. Thus, the second impurity layer 41 is formed to be shallower than the conventional second impurity layer, toward the transport direction of the electric charges. As a result, a depletion layer formed at the boundary part between the first impurity layer 23 and the second impurity layer 41 is wider onto the entire front surface of the semiconductor substrate 11 than that of the conventional solid-state imaging apparatus.

The second impurity layer 41 may entirely become shallower in a slope-like manner toward the transport direction of the electric charges, as long as the high concentration impurity layer 23h of the "n+1" first impurity layer 23 is not exposed from the semiconductor substrate 11.

As shown in FIG. 12, however, if the second impurity layer 41 is formed, it is possible to eliminate that the high concentration impurity layer 23h is exposed from the semiconductor substrate 11. Thus, as shown in FIG. 12, the second impurity layer 41 preferably has a constant depth in one part.

Descriptions will now be made to a method for manufacturing the solid-state imaging apparatus 40 according to this embodiment. This method has a different process for forming the second impurity layer 41 from that of the manufacturing method for the solid-state imaging apparatus according to the first embodiment. In this embodiment, the second impurity layer 41 is formed by using a grating mask 42, like the modification of the manufacturing method for the solid-state imaging apparatus 10 according to the first embodiment. Descriptions will now be made to a process for forming the second impurity layer 41 by using the grating mask 42, with reference to FIGS. 13 to 16.

FIG. 13A to 13C are diagrams for explaining the grating mask 42 for forming a resist layer 43 including a concave portion 43a, in the method for forming the solid-state imaging apparatus 40 according to the second embodiment. Specifically, FIG. 13A is a partial top view of the grating mask 42, FIG. 13B is a partial cross sectional view of the grating mask 42, taken along a dashed line Y-Y' of FIG. 13A, and FIG. 13C shows transmittance characteristics of the grating mask 42.

As shown in FIGS. 13A and 13B, a transmission region 44 formed in the grating mask 42 has a form corresponding to its pixel 13 formed. A plurality of transmission regions 44 are provided in one grating mask 42. The plurality of transmission regions 44 are arranged in matrix in accordance with the arrangement of the pixels 13. These feature points are the same as those of the grating mask 36 shown in FIG. 9.

The grating mask 42 applied to the method for manufacturing the solid-state imaging apparatus 40 of this embodiment has different transmittance characteristics of each transmission region 44, from those of the grating mask 36 shown in FIG. 9.

As shown in FIG. 13C, in each transmission region 44, the transmittance of the exposure light in this region 44 decreases in a slope-like manner up to a predetermined area toward a direction from "Y" to "Y'" of FIG. 13A, thereafter having a constant factor.

In the transmission region 44, an area in which the transmittance decreases in a slope-like manner is referred to as a first transmission region 441, while an area with a constant transmittance is referred to as a second transmission region 442.

An arrangement density or area of a plurality of dots formed in the first transmission region 441 gets gradually lower toward a direction from "Y" to "Y'" of FIG. 13A. An arrangement density or area of a plurality of dots formed in the second transmission region 442 is constant regardless of its position. The arrangement density or area of the plurality of dots formed at the boundary part of the second transmission region 442 in the boundary part between the first transmission region 441 and the second transmission region 442 coincides with that of the plurality of dots formed at the boundary part of the first transmission region 441.

In this manner, the arrangement density or area of the dots formed in the regions 441 and 442 is adjusted, thereby realizing the transmittance characteristics shown in FIG. 13C.

Figure 14:
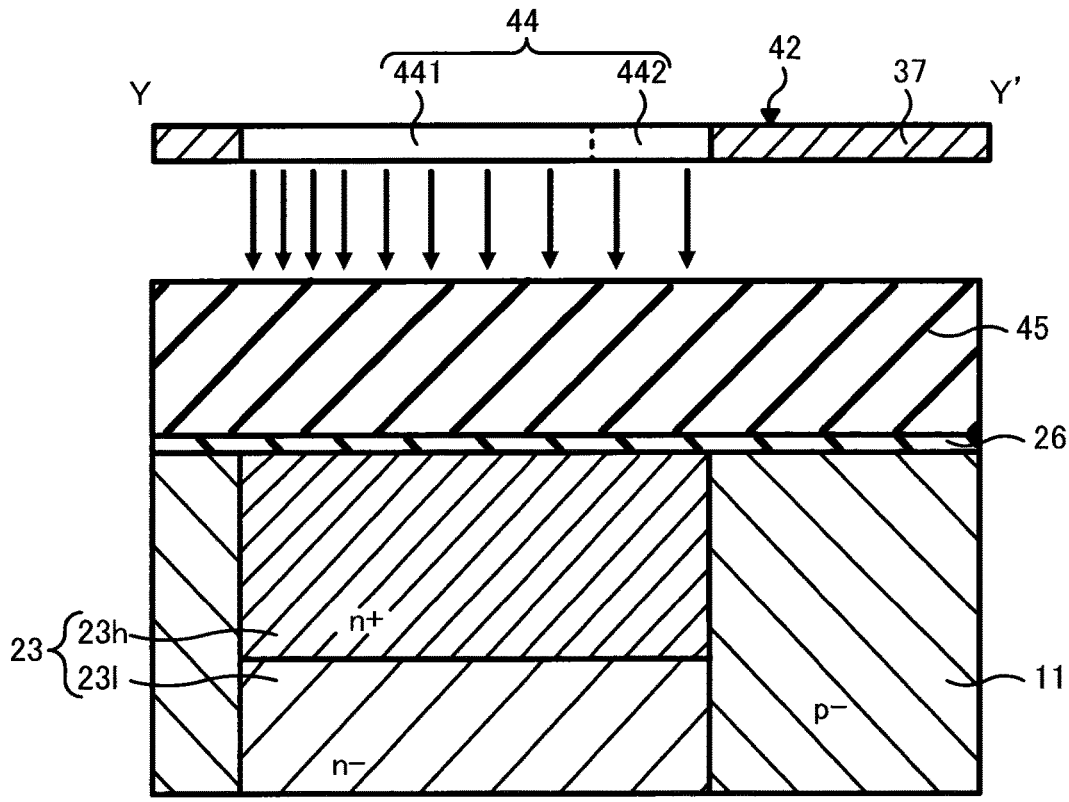
FIG. 14 is a diagram showing a method for manufacturing the solid-state imaging apparatus of FIG. 12, and is a cross sectional view showing a process for exposing a resist member.
Figure 15:
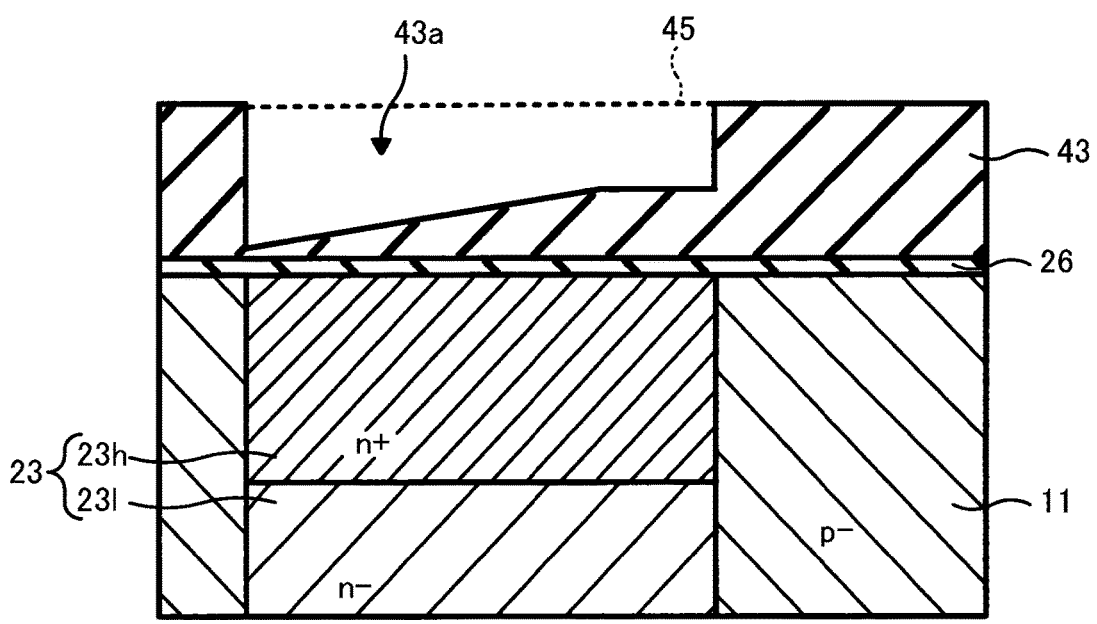
FIG. 15 is a diagram showing a method for manufacturing the solid-state imaging apparatus of FIG. 12, and is a cross sectional view showing a process for developing the exposed resist member.
Figure 16:
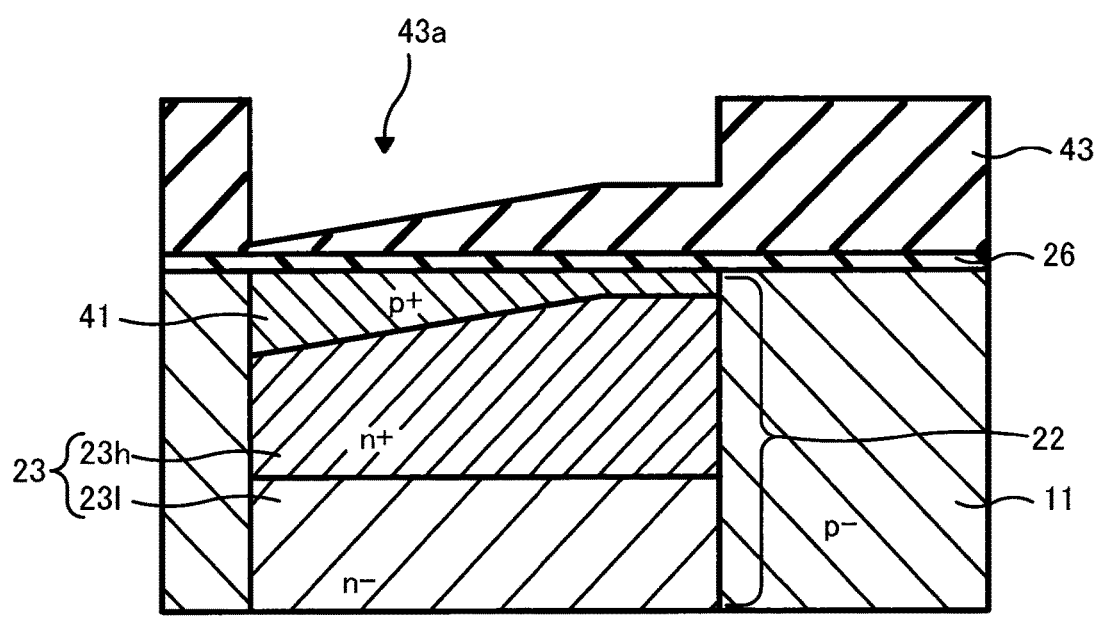
FIG. 16 is a diagram showing a method for manufacturing the solid-state imaging apparatus of FIG. 12, and is a cross sectional view showing a process for forming the third impurity layer of the photodiode layer.

Descriptions will now be made to a process for forming the second impurity layer 41 by using thus formed grating mask 42, with reference to FIGS. 14 to 16. FIGS. 14 to 16 are cross sectional views corresponding to FIG. 12, for explaining the process for forming the second impurity layer 41, in the method for manufacturing the solid-state imaging apparatus 40 according to the second embodiment.

Figure 13:
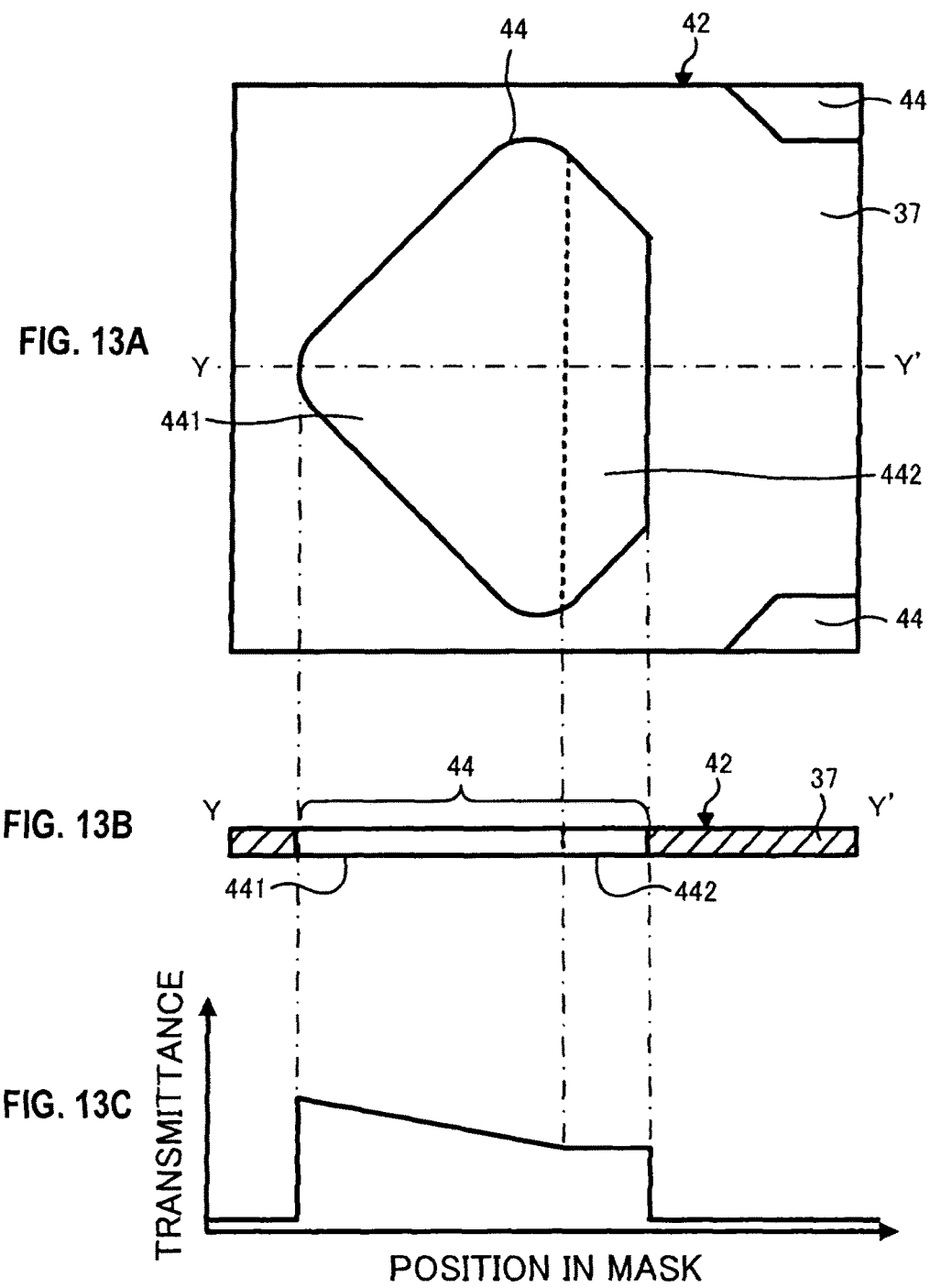
FIGS. 13A to 13C are diagrams for explaining a grating mask for use in forming a resist layer including a concave portion, in the solid-state imaging apparatus according to the second embodiment.

As shown in FIG. 14, a resist member 45 having a constant thickness is formed through the oxide film 26 on the front surface of the semiconductor substrate 11 having the "n" first impurity layer 23 formed therein. Further, the grating mask 42 shown in FIG. 13 is so arranged that the direction from "Y" to "Y'" coincides with the transport direction of the electric charges, on the semiconductor substrate 11 on which this resist member 45 is formed. After this, the resist member 45 is exposed by using the arranged grating mask 42.

Because the exposure light transmits through the transmission region 44 of the grating mask 42, it is irradiated to the resist member 45 right under the transmission region 44. The transmittance of the transmission region 44 decreases in a slope-like manner toward a direction from "Y" to "Y'" in the first transmission region 441, and is constant in the second transmission region 442. Exposure light is irradiated to the resist member 45 right under the first transmission region 441 such that an amount of exposure light decreases in a slope-like manner toward a direction from "Y" to "Y'". In addition, exposure light is irradiated to the resist member 45 right under the second transmission region 442 such that an amount of exposure light is constant regardless of its position.

When thus exposed resist member 45 is developed, as shown in FIG. 15, the more the irradiated part with the exposure light in the resist member 45, the more removed. The resist layer 43, with the concave portion 43a having a bottom thickness which gets thicker in a slope-like manner toward the transport direction of the electric charges, is formed. After this, the resist layer 43 including the concave portion 43a whose bottom thickness is constant may be formed.

As shown in FIG. 16, desired ions are implanted to the front surface of the first impurity layer 23, by using the resist layer 43 formed in the process shown in FIG. 15, thereby forming the "p+" second impurity layer 41.

In this process, the desired ions reach the deeper part, as the bottom surface of the concave portion 43a is thinner. Thus, if the desired ions are implanted by using the resist layer 43 including the concave portion 43a shown in FIG. 15 as a mask, the depth becomes shallower in a slope-like manner up to a predetermined area toward the transport direction of the electric charges, based on the bottom thickness of the concave portion 43a. Then, the second impurity layer 41 having a constant depth is formed.

The method for manufacturing the solid-state imaging apparatus 40 according to the second embodiment is the same as the method for manufacturing the solid-state imaging apparatus 10 according to the first embodiment, thus will not be described again.

Figure 17A:
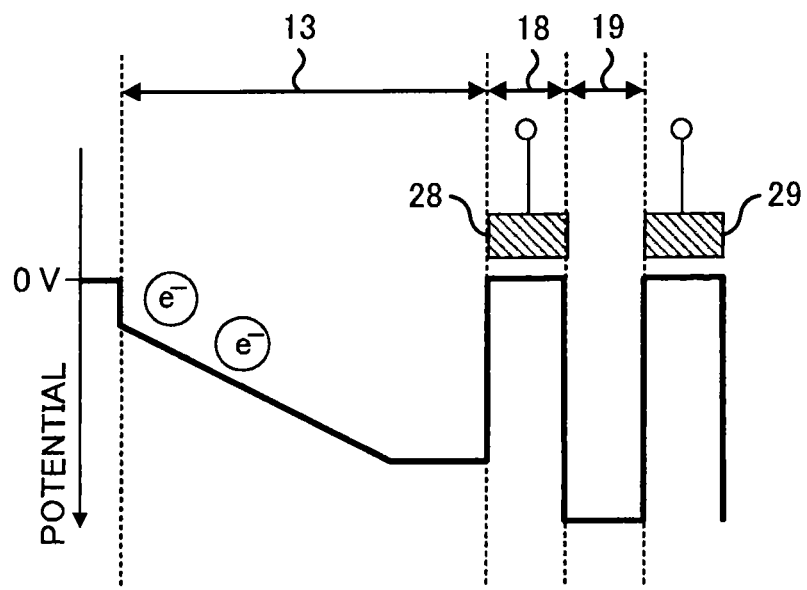
FIGS. 17A and 17B are explanatory diagrams for explaining a charge transport operation by the pixel portion of the solid-state imaging apparatus according to the second embodiment.
Figure 17B:
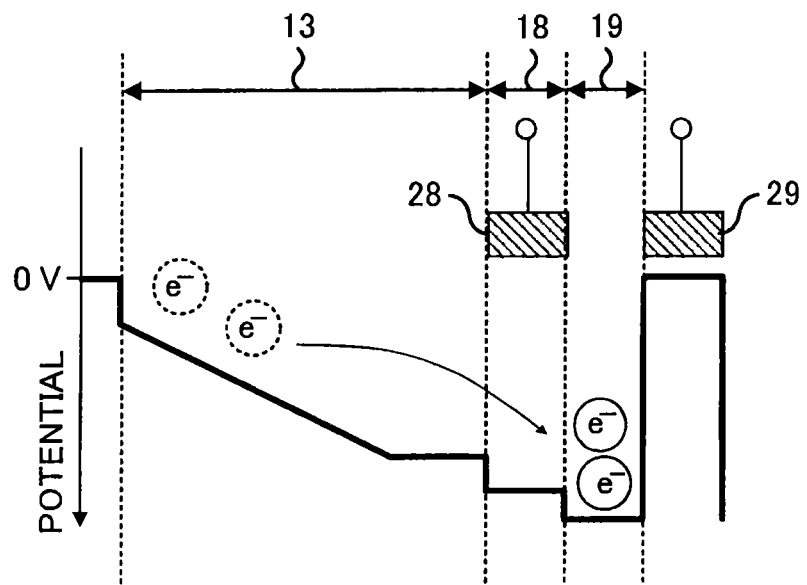

In the pixel portion 14 of thus formed solid-state imaging apparatus 40 according to the second embodiment, the electric charges generated in the PD layer 22 is transported to the FD unit 19, by applying a voltage to the gate electrode 28. Descriptions will now be made to an operation for transporting the electric charges by this pixel portion 14, with reference to FIGS. 17A and 17B. FIGS. 17A and 17B are explanatory diagrams for explaining an operation for transporting the electric charges by the pixel portion 14. Specifically, FIG. 17A shows the potential created in the pixel portion 14 when no voltage is applied to the gate electrode 28, and FIG. 17B shows the potential created in the pixel portion 14 when a voltage is applied to the gate electrode 28.

As shown in FIG. 17A, when no voltage is applied to the gate electrode 28, the potentials of the pixel 13 and the FD unit 19 become deeper than that of the surrounding semiconductor substrate 11. The pixel 13 includes the "p+" second impurity layer 41, while the FD unit 19 includes the "n+" third impurity layer 25. Thus, the potential of the pixel 13 becomes shallower than that of the FD unit 19. Further, the depth of the "p+" second impurity layer 41 becomes shallower in a slope-like manner up to a predetermined area toward the transport direction of the electric charges, and is constant afterwards. Therefore, the potential of the pixel 13 gets deeper in a slope-like manner up to a predetermined area toward the transport direction of the electric charges, and is constant afterwards.

When no voltage is applied to the gate electrode 28, the potential of the semiconductor substrate 11 right under the gate electrode 28 forms a potential barrier. Thus, the electric charges generated in the pixel 13 are not transported to the FD unit 19, and thus are accumulated in the pixel 13. At this time, the electric charges generated in the pixel 13 are accumulated in an order sequentially from parts with deeper potentials.

When a voltage is applied to the gate electrode 28 in a state where the electric charges are accumulated in the pixel 13, as shown in FIG. 17B, the potential of the semiconductor substrate 11 right under the gate electrode 28 becomes deep. For example, if a desired voltage is applied to the gate electrode 28, and the potential of the semiconductor substrate 11 right under the gate electrode 28 is deeper than that of the pixel 13 and shallower than that of the FD unit 19, the electric charges accumulated in the pixel 13 are transported to the FD unit 19. At this time, the potential of the pixel 13 is deeper in a slope-like manner toward the transport direction of the electric charges, thus enabling to efficiently transport the electric charges.

In thus described solid-state imaging apparatus 40 and the method for manufacturing the solid-state imaging apparatus 40, the "p+" second impurity layer 41 of the PD layer 22 is formed to be shallower in the transport direction of the electric charges. As a result, it is possible to provide the solid-state imaging apparatus 40 and the method for manufacturing the solid-state imaging apparatus 40, improving the transport efficiency of the electric charges.

In the solid-state imaging apparatus 40 according to the present invention and the method for manufacturing the solid-state imaging apparatus 40, the "p+" second impurity layer 41 which is shallower toward the transport direction of the electric charges is applied to the backside illuminated solid-state imaging apparatus. Therefore, even in the backside illuminated solid-state imaging apparatus 40 according to the present invention and the method for manufacturing the backside illuminated solid-state imaging apparatus 40, the light sensitivity with the respect to the visible light of incident light L (FIG. 12) can be constant regardless of the wavelength.

In the solid-state imaging apparatus 40 of this embodiment, the "p+" second impurity layer 41 has a depth which becomes deeper in a slope-like manner toward the transport direction of the electric charges. Thus, the potential of the pixel 13 in the solid-state imaging apparatus 40 according to the present embodiment may have a less flat area than the potential of the pixel 13 included in the solid-state imaging apparatus 10 (FIG. 3) according to the first embodiment. Therefore, according to the solid-state imaging apparatus 40 of the present embodiment and the method for manufacturing the solid-state imaging apparatus 40, the transport efficiency of the electric charges can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the solid-state imaging apparatuses 10 and 40 according to the present embodiment are the backside illuminated solid-state imaging apparatuses. However, the second impurity layers 24 and 41 of the PD layer 22 described in the above embodiments may be applied to a front-side illuminated solid-state imaging apparatus. In the backside illuminated solid-state imaging apparatus, the wiring layer 27 is formed on the front surface of the semiconductor substrate 11, and light is irradiated from the backside of the semiconductor substrate 11. On the contrary, in the frontside illuminated solid-state imaging apparatus, the wiring layer is formed on the front surface of the semiconductor substrate, and also light is irradiated from the front surface of the semiconductor substrate.

The number of pixels included in the pixel portion 14 is not limited to two, and may, for example, be four.

What is claimed is:

1. A solid-state imaging apparatus comprising:
a first impurity layer formed in a semiconductor substrate, the first impurity layer generating electric charges by irradiating light to the first impurity layer;
a second impurity layer formed on a surface of the first impurity layer in contact with the first impurity layer, the second impurity layer having a depth which becomes shallower in a slope-like manner toward a predetermined direction;
a third impurity layer formed in a position spaced apart from the first impurity layer and the second impurity layer on a front surface of the semiconductor substrate, the third impurity layer being transported the electric charges generated in the first impurity layer; and
an electrode formed between the second impurity layer and the third impurity layer on the front surface of the semiconductor substrate, the electrode reading the electric charge generated in the first impurity layer and transporting the read electric charges to the third impurity layer, wherein
a plurality of pixels are formed on the semiconductor substrate, each of the pixels including a photodiode, having the first impurity layer and the second impurity layer, and the electrode,
the electrode is formed in a position adjacent to the photodiode,
each pair of the plurality of pixels forms one cell,
the third impurity layer is arranged between the electrodes in the cell,
the semiconductor substrate includes a fourth impurity layer adjacent to the cell,
the first impurity layer includes a first outermost edge horizontally adjacent and contacting the fourth impurity layer, a low concentration impurity layer having a constant depth, and a high concentration impurity layer formed on the low concentration impurity layer and having a constant depth,
the second impurity layer includes a second outermost edge horizontally adjacent and contacting the fourth impurity layer,
wherein the first outermost edge and the second outermost edge are formed in a vicinity of an interface between the first impurity layer and the second impurity layer, the second outermost edge of the second impurity layer is formed above and vertically aligned at substantially the same position as the first outermost edge of the first impurity layer, the first impurity layer having a third outermost edge and the second impurity layer having a fourth outermost edge, wherein the third outermost edge is opposite to the first outermost edge and arranged further away from the third impurity layer than the first outermost edge, the fourth outermost edge is opposite to the second outermost edge and arranged further away from the third impurity layer than the second outermost edge,
the predetermined direction in the second impurity layer is a direction from the fourth outermost edge to the second outermost edge,
the second impurity layer becomes thinner in a direction from the fourth outermost edge to the second outermost edge.

2. The solid-state imaging apparatus according to claim 1, wherein
the second impurity layer is formed by implanting ions into the semiconductor substrate once.

3. The solid-state imaging apparatus according to claim 1, wherein
the second impurity layer further includes an area having a constant depth, and the area having a constant depth is connected to a shallowest area included in the area with a depth which becomes shallower in a slope-like manner.

4. The solid-state imaging apparatus according to claim 3, wherein
the second impurity layer is formed on an entire surface of the first impurity layer.

5. The solid-state imaging apparatus according to claim 4, wherein
the second impurity layer is formed by implanting ions into the semiconductor substrate once.

6. The solid-state imaging apparatus according to claim 1, wherein
electric charges are generated by irradiating the light to the first impurity layer from a backside of the semiconductor substrate.

7. The solid-state imaging apparatus according to claim 6, further comprising
a micro-lens on the back surface of the semiconductor substrate.

8. The solid-state imaging apparatus according to claim 1, wherein
the second impurity layer becomes gradually thinner in a direction from the fourth outermost edge to the second outermost edge.

9. The solid-state imaging apparatus according to claim 1, wherein
the first outermost edge and the second outermost edge are at the same position in the vicinity of the interface between the first impurity layer and the second impurity layer.

* * * * *